United States Patent [19]

Arntz

[11] Patent Number: 5,539,356

[45] Date of Patent: Jul. 23, 1996

[54] DC COUPLED AMPLIFIER FED BY AN RF DETECTOR

[75] Inventor: Bernard J. Arntz, Morris Township, Morris County, N.J.

[73] Assignee: AT&T Corp., Murray Hill, N.J.

[21] Appl. No.: 437,528

[22] Filed: May 9, 1995

Related U.S. Application Data

[63] Continuation of Ser. No. 361,914, Dec. 22, 1994, abandoned, which is a continuation of Ser. No. 103,841, Aug. 9, 1993, abandoned.

[51] Int. Cl.$^6$ .............................. H03D 1/06; H03D 1/10
[52] U.S. Cl. .......................... 329/370; 455/296; 348/707; 329/349; 327/362; 330/69
[58] Field of Search ...................................... 329/347, 349, 329/363, 365, 370, 352; 330/9, 258, 259, 69; 332/149, 159, 162; 327/362, 583, 355, 561; 455/341, 296; 348/707

[56] References Cited

U.S. PATENT DOCUMENTS

| | | | |
|---|---|---|---|
| 2,629,819 | 2/1953 | Dome et al. ............................ | 329/370 |
| 3,448,398 | 6/1969 | Ball et al. ............................... | 330/69 |
| 3,936,720 | 2/1976 | von Recklinghausen ............... | 330/259 |
| 4,037,170 | 7/1977 | Richards ................................. | 330/69 |
| 4,258,327 | 3/1981 | Fujimoto ................................ | 329/349 |
| 4,492,926 | 1/1985 | Kusakabe et al. .................... | 329/370 X |
| 4,689,576 | 8/1987 | Wisseman ........................... | 307/491 X |
| 4,791,380 | 12/1988 | Chiappetta ......................... | 307/491 X |
| 4,851,719 | 7/1989 | Hitomi .................................... | 307/521 |
| 5,103,122 | 4/1992 | O'Leary et al. ....................... | 307/491 |
| 5,175,749 | 12/1992 | Ficht et al. .............................. | 375/76 |

OTHER PUBLICATIONS

EDN, Design Ideas, "Composite Buffer Provides Speed, Stability" by Bernardi et al. Jun. 20, 1980, p. 193.

*Primary Examiner*—Robert Pascal
*Assistant Examiner*—Arnold Kinkead
*Attorney, Agent, or Firm*—Jason P. DeMont

[57] ABSTRACT

A DC coupled amplifier fed by an RF detector is taught which has greater dynamic range capabilities than techniques in the prior art. An illustrative embodiment of the present invention advantageously comprises a low-off set voltage, low-offset current differential amplifier fed by an RF detector having a fifth lead from the reference voltage node within the RF detector.

9 Claims, 1 Drawing Sheet

5,539,356

DC COUPLED AMPLIFIER FED BY AN RF DETECTOR

This application is a continuation of application Ser. No. 08/361,914, filed on Dec. 22, 1994, now abandoned, which is a continuation of application Ser. No. 08/103,841, filed on Aug. 9, 1993, and now abandoned.

FIELD OF THE INVENTION

The present invention relates to electric circuit design in general, and more particularly, to methods and apparatus which detect and amplify a DC coupled signal.

BACKGROUND OF THE INVENTION

As shown in FIG. 1, RF detector 105 feeds single-ended amplifier 107 a DC coupled video signal. Depending upon the mechanical construction of the apparatus comprising RF detector 105 and single-ended amplifier 109, the return current from RF detector 105 can take several paths. Bulkhead grounding through coaxial connectors usually takes most of the current, but some always flows through the sneak paths, represented by ground resistors 151, causing a voltage error at the reference ground lead 121. This voltage, while perhaps only a millivolt, can easily drown the signal voltage in applications that require a wide dynamic range. The result is that part of the voltage error propagates through RF detector 105 and is superimposed on top of the signal on lead 125.

SUMMARY OF THE INVENTION

The present invention provides a mechanism for detecting a DC coupled RF signal while avoiding many of the costs and restrictions associated with prior techniques. Specifically, embodiments of the present invention are generally less susceptible to ground loops than techniques in the prior art.

These results are obtained in an illustrative embodiment of the present invention which comprises an RF detector and a differential amplifier wherein a first differential input to the differential amplifier is connected to the signal output of the RF detector and a second differential input is connected to a reference node in the RF detector.

DETAILED DESCRIPTION

Figure 1:
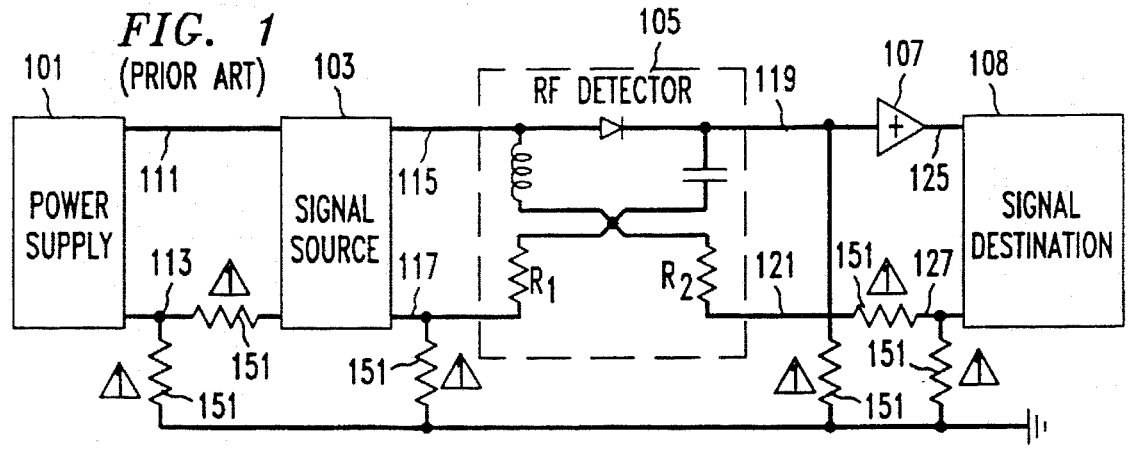
FIG. 1 shows a schematic diagram of a DC coupled amplifier as in the prior art.
Figure 2:
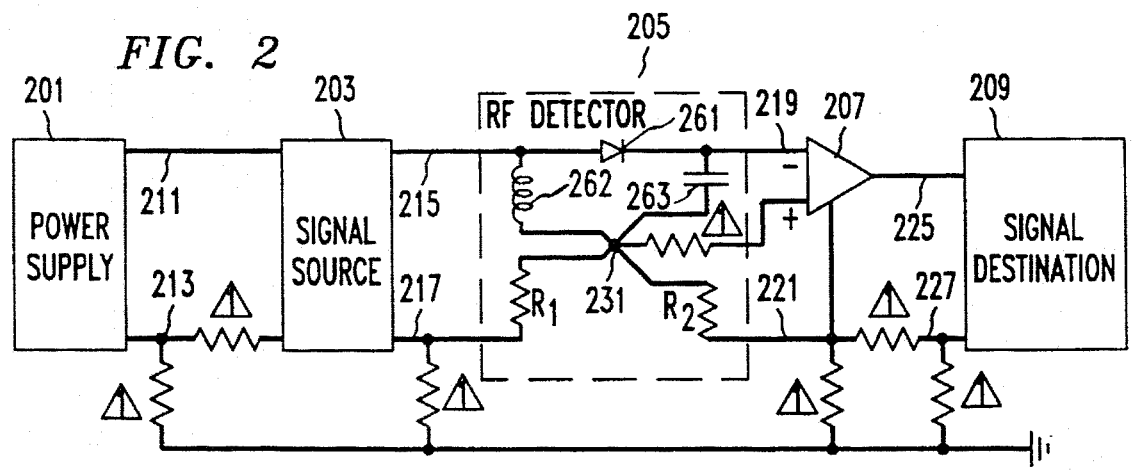
FIG. 2 shows a schematic diagram of an illustrative embodiment of the present invention.

FIG. 2 depicts a block diagram of an illustrative embodiment of the present invention, which detects and amplifies a DC coupled RF signal. The illustrative embodiment advantageously comprises: power supply 201, signal source 203, RF detector 205, differential amplifier 207 and signal destination 209. Signal source 203 is advantageously capable of amplitude modulating an RF signal and of outputting the modulated signal onto lead 215.

RF detector 205 advantageously comprises: diode 261, inductor 262, capacitor 263, and reference node 231. Diode 261 is preferably a zero-biased diode or a tunnel diode between lead 215 and lead 219. Inductor 262 advantageously lies between lead 215 and reference node 231. Capacitor 263 advantageously lies between lead 219 and reference node 231. Resistors $R_1, R_2$, and those designated by 251 are parasitic resistors caused by the mechanical connections, and by the bulk resistivity of the metals. Typical values of resistance are in the range of 20 to 1000 micro-ohms.

Figure 3:
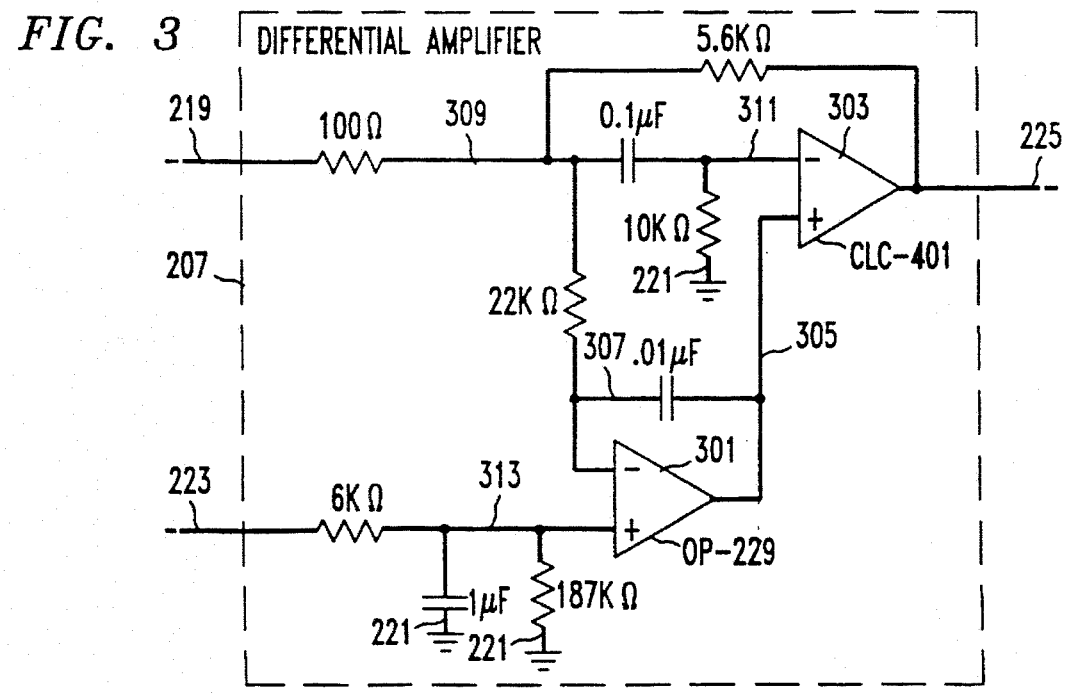
FIG. 3 shows an illustrative differential amplifier suitable for incorporation in the illustrative embodiment shown in FIG. 2.

Differential amplifier 207 is preferably a video amplifier (i.e., which amplifies down to 0 Hz) and is characterized by a low offset voltage and a low offset current. A schematic diagram of an illustrative differential amplifier suitable for incorporation into the illustrative embodiment is shown in FIG. 3. The non-inverting input of differential amplifier 207 is advantageously connected to the signal output of RF detector 205 via lead 219. The inverting input of differential amplifier 207 is advantageously connected to reference node 231 via lead 223. Since there is almost no current in this lead, any resistance associated with the lead is of no consequence. The non-inverting input of differential amplifier 207 can, however, alternately be connected to reference node 231 when the inverting input is connected to the signal output of RF detector 205. The output of differential amplifier 207 is fed into the signal destination via lead 225. With this configuration, voltage offsets from the parasitic resistances are canceled.

FIG. 3 shows a schematic diagram of a differential amplifier characterized by a low offset voltage and a low offset current. This configuration is often referred to as a composite amplifier. Differential amplifier 207 is a composite amplifier comprising amplifier 301 and amplifier 303. Amplifier 301 is preferably a low-speed, high-precision DC amplifier such as Analog Device's OP-227 and amplifier 303 is preferably a high-speed, low-precision videoamplifier such as Comlinear Corporation's CLC-401. The composite amplifier has the precision of amplifier 301 and the speed of amplifier 303. Both amplifiers operate in conjunction to force lead 309 to a virtual ground at all frequencies including DC. The inverting input 223 has much less bandwidth than the non-inverting input. From the above detailed description, it will be clear to those skilled in the art how to make and use many variations of the present invention.

I claim:

1. An apparatus for detecting a signal, said apparatus comprising:
   (1) an RF detector comprising:
      (a) a signal-in lead,
      (b) a ground-in lead,
      (c) a signal-out lead,
      (d) reference lead, and
      (e) a ground-out lead; and
   (2) a differential amplifier comprising:
      (a) a first differential input coupled to said signal-out lead,
      (b) a second differential input, of different polarity than said first differential input, connected to said reference lead connected to a reference node in the RF detector to provide a voltage to said amplifier that substantially offsets voltage drops in said RF detector due to parasitic resistances,
      (c) a ground reference lead connected to said ground-out lead, and
      (d) an amplifier output.

2. The apparatus of claim 1 wherein said differential amplifier further comprises a composite amplifier.

3. The apparatus of claim 2 wherein said composite amplifier comprises:

(i) a low-speed, high-precision DC amplifier; and (ii) a high-speed, low-precision videoamplifier.

4. The apparatus of claim 3 wherein:

said low-speed, high-precision DC amplifier comprises an output lead;

said high-speed, low-precision video amplifier comprises an inverting input and a non-inverting input; and said output lead is connected to said non-inverting input.

5. An apparatus for detecting a signal, said apparatus comprising:

(1) an RF detector comprising:
 (a) a signal-in lead,
 (b) a ground-in lead,
 (c) a signal-out lead,
 (d) a diode in series between said signal-in lead and said signal-out lead,
 (e) reference lead, and
 (f) a ground-out lead; and (2) a differential amplifier comprising:
 (a) a first differential input coupled to said signal-out lead,
 (b) a second differential input, of different polarity than said first differential input, connected to said reference lead connected to a reference node in the RF detector to provide a voltage to said amplifier that substantially offsets voltage drops in said RF detector due to parasitic resistances,
 (c) a ground reference lead connected to said ground-out lead, and
 (d) an amplifier output.

6. The apparatus of claim 5 wherein said diode is unbiased diode.

7. The apparatus of claim 1 further comprising an inductor in series between said signal-in lead and said reference lead.

8. The apparatus of claim 7 further comprising a capacitor in series between said signal-out lead and said reference lead.

9. The apparatus of claim 5 wherein said diode is a zero-biased diode.

* * * * *